United States Patent [19]

Kato

[11] Patent Number: 4,710,263

[45] Date of Patent: Dec. 1, 1987

[54] METHOD OF FABRICATING PRINT HEAD FOR THERMAL PRINTER

[75] Inventor: Masakazu Kato, Furukawa, Japan

[73] Assignee: Alps Electric Co., Ltd., Japan

[21] Appl. No.: 904,629

[22] Filed: Sep. 5, 1986

[30] Foreign Application Priority Data

Sep. 11, 1985 [JP] Japan .................. 60-200819

[51] Int. Cl.$^4$ .......................... C23F 1/00; C23F 1/02; B44C 1/22; C03C 15/00
[52] U.S. Cl. .................................. 156/637; 156/630; 156/634; 156/649; 156/652; 156/656; 156/659.1; 219/216; 346/76 PH
[58] Field of Search ............. 219/216 PH; 346/76 PH; 156/629, 630, 637, 634, 649, 654, 652, 656, 659.1

[56] References Cited

U.S. PATENT DOCUMENTS

| | | | |
|---|---|---|---|
| 4,076,860 | 2/1978 | Kuroda | 156/656 X |
| 4,169,032 | 9/1979 | Haase et al. | 156/656 X |
| 4,617,088 | 10/1986 | Nishiguchi et al. | 156/656 |

OTHER PUBLICATIONS

Kanazawa et al., A High Speed, High Performance, Scanning Thin Film Thermal Printhead, Q-0002748, 55.9.12, pp. 122-127.

Primary Examiner—William A. Powell
Attorney, Agent, or Firm—Guy W. Shoup

[57] ABSTRACT

A method of fabricating a print head for use in a thermal printer is similar to the additive (or lift-off) method of pattern transfer utilizing semiconductor fabrication technology except that a metal film is used instead of photoresist conventionally used. The method is initiated by glazing a substrate. Then, nickel is sputtered on the glazed substrate. That portion of the formed nickel film that lies under the heater portion of the head is removed by photoetching. Subsequently, the remaining nickel film is plated with nickel, and a chemically stable and heat-resistant insulator, such as $Ta_2O_5$, is sputtered on the plated laminate. Thereafter, the plating layer and the nickel film are removed to leave the portion of the insulator layer that lies under the heater portion. The remaining layer protrudes to the heater portion.

13 Claims, 10 Drawing Figures

METHOD OF FABRICATING PRINT HEAD FOR THERMAL PRINTER

FIELD OF THE INVENTION

The present invention relates to a method of fabricating a print head that is used in a thermal printer and, more particularly, to a method of forming an insulator layer which lies on a glaze layer and protrudes to the heater portion of the head.

BACKGROUND OF THE INVENTION

A cross section of a conventional print head for use in a thermal printer is shown in FIG. 4, where a glaze layer 2, a resistor layer 3 as made from a film of $Ta_2N$ for producing heat, a conductor layer 4 as made from a film of Al for supplying electric power, and a protective layer 5 are stacked on a substrate 1 of alumina in this order. A heater portion 6 produces heat to give thermal energy to thermosensitive paper 7, for making a visible mark.

In the print head shown in FIG. 4, the heater portion 6 is concave in shape and so it fails to make intimate contact with the thermosensitive paper 7, deteriorating the heat transfer efficiency. In an attempt to avoid this difficulty, an improved print head shown in FIG. 1 has been proposed. This head is characterized by the formation of an insulator layer 8 beneath a heater portion 6 and on a glaze layer 2. Thus, the heater portion 6 protrudes so that the head may make intimate contact with thermosensitive paper, thus improving the heat transfer efficiency. Specific examples of this proposed head are next described.

Japanese Patent Laid-Open No. 123442/1975 has disclosed a method of fabricating such a structure by forming an insulator layer of $SiO_2$ that can be readily etched over the whole surface of a glaze layer as mentioned above and then etching away the layer except for the portion that bears on the heater portion. According to this method, however, the following problem arises during etching process. Since glaze layers usually used for print heads of thermal printers are required to have resistance to heat, they are made from a glass material containing $SiO_2$ as its main constituent and having a high melting point. This makes it difficult to selectively etch the film of $SiO_2$ and the underlying glaze layer. Thus, when the film of $SiO_2$ is etched, the underlying glaze layer is eroded. Then, the surface of the eroded glaze layer becomes very rough. As a result, the formation of a wiring pattern in a conductor layer formed on this glaze layer is adversely affected. Also, it is possible to make the insulator layer from materials other than $SiO_2$. However, they are limited to insulators of high melting points, because the layer is heated. These insulators of high melting points are generally difficult to etch. In this way, usable etchants are restricted to fluorides, similarly to the case where the insulator layer is made from $SiO_2$. Hence, problems similar to the foregoing arise. In connection with this, the resistor layer 3 producing heat is formed on the insulator layer 8, as shown in FIG. 1, and a pattern is formed by photoetching. The resistor layer 3 consists mainly of a metal of a high melting point, such as $Ta_2N$. Again, etchants of fluorides are usually used. Accordingly, if the insulator layer is made from an etchable material, such as $SiO_2$, then when the resistor layer is patterned, it is eroded. The result is that the accuracy with which the pattern is formed deteriorates greatly.

Japanese Patent Laid-Open No. 20745/1979 has disclosed another method of forming a film by the use of a metal mask that is obtained by blanking a metal sheet into a desired pattern. More specifically, the metal mask is placed on a glaze layer. An insulator is deposited as a film from above the mask by sputtering or evaporation. Then, the mask is removed to form an insulator layer of a desired pattern on the glaze layer. This method is effective in patterning an insulator layer which is chemically stable and, therefore, difficult to etch. However, the formed pattern varies widely from product to product, resulting in a low manufacturing yield. This is due to the fact that a gap is left between the mask and the glaze layer. This tendency becomes more conspicuous as the size of the substrate increases. Further, while the film is being formed, temperature increase expands the metal mask, enlarging the aformentioned gap. Where the gap exists between the mask and the glaze layer in this manner, particles of the film find entry into the gap during the formation of the film. As a result, the outer portion of the pattern of the insulator layer formed on the glaze layer spreads and becomes extremely unclear. In addition, the shape varies widely from product to product. In this way, when the method of forming a film with a metal mask is utilized, the pattern of insulator layer is fabricated with poor accuracy. Further, the shape of the pattern differs greatly among products. Consequently, this technique is not adapted for the formation of the insulator layer 8 shown in FIG. 1.

In a third method, a photoresist film is formed on a glaze layer except for the portion which makes contact with a heater portion. Then, a chemically stable insulator of a high melting point is sputtered on the photoresist film. Subsequently, the photoresist film is peeled off and removed to leave only the portion of the insulator film which lies under the heater portion as shown in FIG. 1. This method is called lift-off method. Although this method is effective in patterning a film that cannot be etched, it cannot be put into practical use where the temperature of the substrate is elevated as during sputtering process. In particular, even when a magnetron is employed for sputtering, resulting in a relatively small increase of the temperature of the substrate, the temperature reaches as high as 150° to 180° C. during the film growth. Therefore, the previously patterned photoresist is baked. This makes it difficult to lift off the photoresist. This baking cannot be avoided even if a heat-resistant photoresist that begins to flow at a high temperature of 200° C. is used. We assume from this phenomenon that the actual temperature increase on a microscopic scale is considerably high. This temperature might be called the atomic temperature of atoms composing the film and coming from the target during sputtering process.

It is possible to form a film without elevating the substrate temperature by evaporation in vaccuum, in which case the baking of the photoresist can be circumvented and the photoresist can be lifted off. However, when the substrate temperature is low, the formed film does not strongly stick to the underlying layer. Especially, when the head is actually used in a thermal printer, a mechanical force is directly applied to the surface. This will introduce the problem that the film peels off.

Thus, the lift-off method using photoresist poses practical problems associated with the lift-off and removal of the photoresist subsequent to the formation of the film and also with the adhesion of the film. Hence, this method cannot be applied as it is to pattern an insulator layer on a glaze layer beneath the heater portion of the print head of a thermal printer.

SUMMARY OF THE INVENTION

The present invention is intended to solve the foregoing problems with the prior art techniques. That is, it is the object of the present invention to provide a method of fabricating a print head which is used in a thermal printer and which comprises a pattern of a chemically stable and heat-resistant insulator layer beneath the heater portion of the head and on a glaze layer, the insulator layer adhering well to the glaze layer.

The method of patterning an insulator layer in accordance with the invention is essentially an improvement over the lift-off method. The novel method is characterized by the use of a metal film instead of the photoresist layer heretofore employed.

Specifically, the invention resides in a method of fabricating a print head which is used in a thermal printer and which has a protruding insulator layer on a glaze layer and beneath the heater portion of the head. This method comprises the steps of: forming a thin metal film on the glaze layer except for the portion that lies beneath the heating portion; then plating the metal film with a metal to form a metal layer; forming a chemically stable and heat-resistant insulator layer on the metal layer and on the exposed portion of the glaze layer that makes contact with the heater portion; thereafter removing the metal layer and the thin metal film, whereby the insulator layer on the glaze layer protrudes to the heater portion.

DETAILED DESCRIPTION OF THE INVENTION

First, a substrate of alumina is prepared. Then, the substrate is glazed. Thereafter, a thin metal film, preferably less than about 1 μm thick, is formed over the whole glazed surface of the substrate. The metal of this thin film should be so selected that it is adapted as a metal backing a metal plating (described later). If this thin metal film is too thick, a pattern will be formed with poor accuracy during later photoetching process (described later). Further, it will take a long time to dissolve away metal layers during the last lift-off process. Therefore, it is desired that the thin metal film have the least thickness required as the backing metal film for the plating layer.

Subsequently, the portion of the thin metal film that makes contact with the heater portion of the head is removed by photoetching process. Then, a metal film is formed on the remaining metal film by plating process. Any metal can be used as the material of the plating as long as it allows selective etching of the glaze layer and of an insulator layer (described later). Preferably, this plating film is about two times or more as thick as the later formed insulator layer; otherwise, the insulator layer would cover large step walls, making it difficult to lift off the plating film in the final step. The reasons why the plating film is used in this way in the invention are that thick films can be readily obtained and that they can be shaped according to the shape of the backing film. In particular, since the backing film is thin, it can be patterned with good accuracy. The plating film grows on this pattern and so a metal film accurately patterned can be derived. In this way, large step coverage that is indispensable to the lift-off method can be easily realized by the method according to the invention.

Subsequently, a layer of a chemically stable and heat-resistant insulator is formed over the whole plated surface of the substrate. At this time, it is not necessary to take a countermeasure to prevent the temperature of the substrate from rising when the insulator layer is formed as in the ordinary lift-off method using photoresist. Therefore, the insulator layer can be formed while heating the substrate. Consequently, the insulator layer adheres well to the underlying layer.

Then, the substrate is immersed in a solution that can dissolve the plating film and the thin metal film. If necessary, ultrasonic waves may be applied to the substrate to dissolve them. In this manner, the layer of the chemically stable and heat-resistant insulator can be formed on a portion of the glaze layer of the print head.

Figure 1:
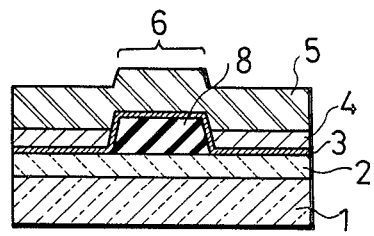
FIG. 1 is a cross-sectional view of main portions of a print head fabricated in accordance with the present invention.

Subsequently, the same manufacturing steps as conventional are carried out to complete a print head as shown in FIG. 1. The heater portion of the completed head is convex in shape, and therefore it makes good physical contact with thermosensitive paper, producing excellent heat transfer efficiency. It has been found that for the same print density, the novel head attained a reduction of about 25% in the electric power consumed, as compared with the conventional head. Further, the novel head prints characters clearly, thus improving print quality. The curtailment in the electric power consumed to print characters reduces the load applied to the head. Hence, the life can be increased.

EXAMPLE 1

FIG. 2 illustrates steps for manufacturing a print head in accordance with the present invention. The shown cross sections of the substrate are taken near the heater portion. First, a substrate 1 of alumina of 0.6 mm thick was prepared. The substrate was then glazed to form a glaze layer 2 of about 40 μm thick. Nickel was sputtered over the whole surface of the glaze layer 2 to form a thin film 9 of Ni of about 0.5 μm thick (FIG. 2(a)). Subsequently, the portion of the thin film 9 of Ni that makes contact with the heater portion was removed by photoetching (FIG. 2(b)). Thereafter, a plating layer 10 of Ni having a thickness of about 4 μm was formed on the remaining thin film 9 of Ni by electroless plating process (FIG. 2(c)). Then, $Ta_2O_5$ was sputtered to a thickness of about 2 μm to form a chemically stable and heat-resistant insulator layer 8 (FIG. 2(d)). Finally, the whole laminate was immersed in nitric acid, and ultrasonic waves were applied to it to dissolve away the Ni plating layer 10 and the thin Ni film 9, whereby insulator layer 8 on the glaze layer 2 protruded to the heater portion 6 (FIG. 2(e)).

The novel method of manufacturing a print head is characterized by the steps described thus far. Thereafter, as shown in FIG. 1, a resistor layer 3 generating heat and a conductor layer 4 supplying electric power were formed by sputtering. The layer 3 consisted of a thin film of Ta$_2$N having a thickness of about 0.05 μm. The conductor layer 4 had a thickness of about 1 μm and was made from Al. Then, the conductor layer 4 and the resistor layer 3 were patterned into a desired shape by photoetching. Subsequently, a protective layer 5 consisting of SiO$_2$ film of about 2 μm thick and Ta$_2$O$_5$ film of about 5 μm thick was formed by sputtering. The heater portion of the print head constructed as described above was convex in shape having a height of about 1 μm. Hence, the head makes good physical contact with photosensitive paper, resulting in excellent heat transfer efficiency.

EXAMPLE 2

Figure 2A:
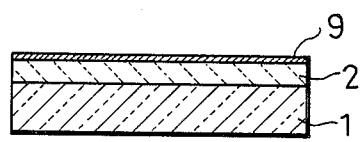
FIGS. 2 (a)–(e) illustrates a sequence of steps for fabricating a print head in accordance with the invention.
Figure 2B:
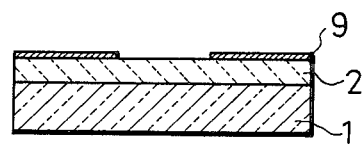
Figure 2C:
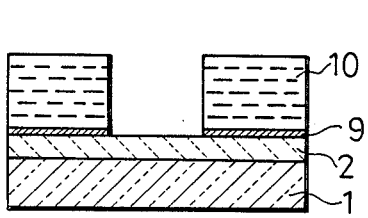
Figure 2D:
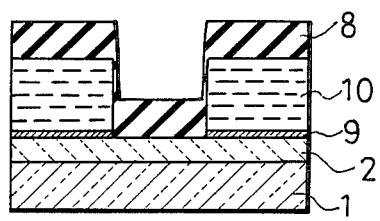
Figure 2E:
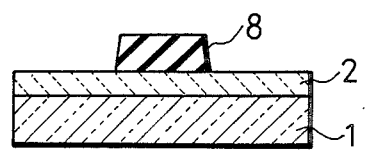
Figure 3:
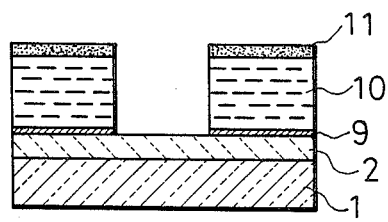
FIGS. 3 (d1)–(d3) illustrates another sequence of manufacturing steps according to the invention.
Figure 3:
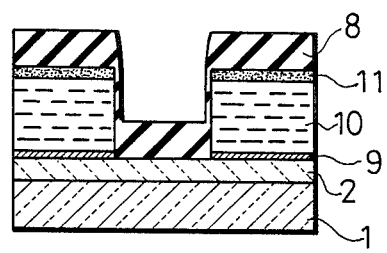
Figure 3:
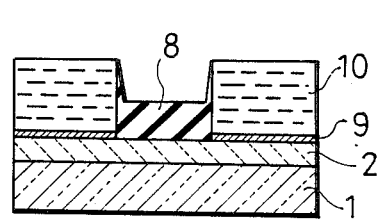
Figure 4:
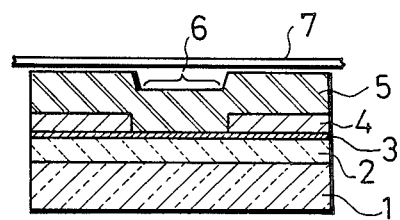
FIG. 4 is a cross-sectional view of main portions of a conventional print head for use in a thermal printer.

This example was intended to facilitate the lift-off operation performed in Example 1 above. The same manufacturing steps as Example 1 were executed up to the step shown in FIG. 2(c). The steps carried out subsequently are illustrated in FIGS. 3 (d1)-(d3). First, as shown in FIG. 3(d1), heat-resistant adhesive tape 11 of polyimide was stuck on the surface of the Ni plating layer 10 so as to cover the surface. Then, an insulator layer 8 of Ta$_2$O$_5$ was formed over the whole surface of the substrate by sputtering, as shown in FIG. 3(d2). Thereafter, the tape 11 was peeled off, with concomitant peeling of Ta$_2$O$_5$ film adhering to the tape. Thus, a cross-sectional shape as shown in FIG. 3(d3) was obtained. Then, the whole laminate was immersed in nitric acid, and ultrasonic waves were applied to it to dissolve away the Ni plating layer 10 and the thin film 9 of Ni in the same way as in Example 1. As a result, the insulator layer 8 was so shaped on the glaze layer 2 that it protruded to the heater portion as shown in FIG. 2(e). This example is characterized in that the Ni plating layer 10 to be dissolved away was exposed as shown in FIG. 3(d3). This greatly facilitated the lift-off operation. Subsequently, the same steps as Example 1 were carried out to complete a print head having the protruding heater portion as shown FIG. 1.

In the above examples, the Ni plating layer 10 was formed by electroless plating, but the invention is not limited to this process. For example, electroplating may also be employed. Further, the metal with which the thin film 10 is plated is not limited to nickel, but rather Cu, Zn, Sn, Cr, or any other metal permitting plating may be used. In addition, the insulator layer 8 can consist of any chemically stable and heat-resistant insulator, such as Si$_3$N$_4$, SiC, TaN, ZrN, and TiN, as well as Ta$_2$O$_5$. Furthermore, the method by which the insulator layer 8 is formed is not limited to sputtering. Also, in Example 2, a metal mask may be used instead of the heat-resistant adhesive tape 11 to cover the surface of the plating layer.

As described thus far, in accordance with the present invention, a chemically stable insulator that is difficult to etch can be deposited as a film on its backing layer with good adhesion to the backing layer, and then the insulator layer can be patterned. This greatly enhances the reliability of the print head. Further, heat is transferred efficiently to thermosensitive paper, i.e., heat transfer efficiency is improved, because the heater portion of the head is convex in shape and makes intimate contact with the paper. Consequently, the print quality is enhanced. Also, only a small amount of electric power is needed to print characters, which in turn increases the life of the head.

What is claimed is:

1. A method of fabricating a print head for use in a thermal printer, comprising the steps of:
   forming a thin metal film on the portion of a glaze layer that does not lie under the heater portion of the head;
   then plating the thin metal film with a metal to form a metal layer;
   forming a layer of a chemically stable and heat-resistant insulator on the portion of the metal layer that lies under the heater portion and also on the exposed portion of the glaze layer; and
   thereafter removing the metal layer and the thin metal film, whereby the insulator layer on the glaze layer protrudes to the heater portion.

2. A method of fabricating a print head as set forth in claim 1, wherein said thin metal film has a thickness of less than 1 μm.

3. A method of fabricating a print head as set forth in claim 1, wherein said thin metal film has a thickness of about 0.5 μm.

4. A method of fabricating a print head as set forth in claim 1, wherein said metal layer is at least twice as thick as the insulator layer.

5. A method of fabricating a print head as set forth in claim 1, wherein said thin metal film is formed by sputtering.

6. A method of fabricating a print head as set forth in claim 1, wherein said thin metal film is formed by forming a thin metal film over the whole surface of the glaze layer and then removing the portion of the film that lies under the heater portion by photoetching.

7. A method of fabricating a print head as set forth in claim 1, wherein said metal with which the thin metal film is plated is Ni, Cu, Zn, Sn, or Cr.

8. A method of fabricating a print head as set forth in claim 1, wherein said metal layer is formed by electroless plating.

9. A method of fabricating a print head as set forth in claim 1, wherein said metal layer is formed by electroplating.

10. A method of fabricating a print head as set forth in claim 1, wherein said chemically stable and heat-resistant insulator is Ta$_2$O$_5$, Si$_3$N$_4$, SiC, TaN, ZrN, or TiN.

11. A method of fabricating a print head as set forth in claim 1, wherein said layer of the insulator is formed by sputtering the insulator on said metal layer and also on the exposed portion of the glaze layer and then removing both the metal layer and the thin metal layer.

12. A method of fabricating a print head as set forth in claim 11, wherein the removal of both the metal layer and the thin metal film is effected by immersing the whole laminate in nitric acid and applying ultrasonic waves to it to dissolve away the metal layer and the metal film.

13. A method of faricating a print head as set forth in claim 1, further comprising the steps of: sticking heat-resistant adhesive tape on said metal layer subsequently to the formation of this metal layer; and peeling off the tape together with the insulator layer subsequently to the formation of the insulator layer.

* * * * *